US012787606B2

(12) United States Patent
Zhang et al.

(10) Patent No.: US 12,787,606 B2
(45) Date of Patent: Nov. 3, 2026

(54) DISPLAY PANEL AND DISPLAY DEVICE

(71) Applicants: Chengdu BOE Optoelectronics Technology Co., Ltd., Chengdu (CN); BOE Technology Group Co., Ltd., Beijing (CN)

(72) Inventors: Bo Zhang, Beijing (CN); Ilsang Lee, Beijing (CN); Hai Zheng, Beijing (CN); Dawei Wang, Beijing (CN); Tianyi Cheng, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 539 days.

(21) Appl. No.: 18/276,649

(22) PCT Filed: May 26, 2022

(86) PCT No.: PCT/CN2022/095329
§ 371 (c)(1),
(2) Date: Aug. 10, 2023

(87) PCT Pub. No.: WO2023/225957
PCT Pub. Date: Nov. 30, 2023

(65) Prior Publication Data
US 2025/0024733 A1 Jan. 16, 2025

(51) Int. Cl.
*H10K 59/80* (2023.01)

(52) U.S. Cl.
CPC .................................. *H10K 59/873* (2023.01)

(58) Field of Classification Search
CPC .................................................... H10K 59/873
See application file for complete search history.

(56) References Cited

U.S. PATENT DOCUMENTS 9,601,717 B2 3/2017 Lee et al.
9,634,287 B1 4/2017 Shin
(Continued)

FOREIGN PATENT DOCUMENTS

AU 2021215098 A1 3/2022
CN 105280677 A 1/2016
(Continued)

OTHER PUBLICATIONS

Zhang, CN 110212110, Sep. 6, 2019 (Year: 2019).*
(Continued)

*Primary Examiner* — Mary Ellen Bowman
(74) *Attorney, Agent, or Firm* — XSENSUS LLP

(57) ABSTRACT

A display device includes a blocking dam. The blocking dam includes an insulation layer group. A groove is provided at one side of the insulation layer group away from the substrate. After the liquid organic encapsulation material flows from the display area to the highest point of the blocking dam, the excess liquid organic encapsulation material may directly fall into the groove, avoiding the excess liquid organic encapsulation material from flowing across the blocking dam to the outside of the encapsulation area, causing that the orthographic projection of the edge of the organic encapsulation layer, away from the display area, on the substrate is located within the orthographic projection of the blocking dam on the substrate. The display panel includes only one blocking dam, and the width of the area, where the blocking dam is provided, of the non-display area decreases, thereby reducing the width of the entire non-display area.

16 Claims, 8 Drawing Sheets

(56) References Cited

U.S. PATENT DOCUMENTS

| | | | | |
|---|---|---|---|---|
| 9,876,194 | B2 | 1/2018 | Lee et al. | |
| 9,966,566 | B2 | 5/2018 | Shin | |
| 10,224,506 | B2 | 3/2019 | Shin | |
| 10,276,831 | B2 | 4/2019 | Lee et al. | |
| 10,680,202 | B2 | 6/2020 | Shin | |
| 10,879,490 | B2 | 12/2020 | Zhang | |
| 11,005,072 | B2 | 5/2021 | Shin | |
| 11,133,483 | B2 | 9/2021 | Kim et al. | |
| 11,950,461 | B2 * | 4/2024 | Long | H10K 59/131 |
| 2015/0380685 | A1 | 12/2015 | Lee et al. | |
| 2016/0204373 | A1 * | 7/2016 | Park | H10K 59/122 257/40 |
| 2017/0141352 | A1 | 5/2017 | Shin | |
| 2017/0149017 | A1 | 5/2017 | Lee et al. | |
| 2017/0207418 | A1 | 7/2017 | Shin | |
| 2018/0108867 | A1 | 4/2018 | Lee et al. | |
| 2018/0183004 | A1 | 6/2018 | Shin | |
| 2018/0226612 | A1 * | 8/2018 | Choi | H10K 59/8731 |
| 2019/0280243 | A1 | 9/2019 | Shin | |
| 2020/0111987 | A1 | 4/2020 | Kim et al. | |
| 2020/0185647 | A1 * | 6/2020 | Lee | G09G 3/3283 |
| 2020/0212354 | A1 * | 7/2020 | Zhang | H10K 59/122 |
| 2020/0274099 | A1 | 8/2020 | Shin | |
| 2021/0226162 | A1 | 7/2021 | Qian et al. | |
| 2021/0234127 | A1 | 7/2021 | Shin | |
| 2022/0085330 | A1 | 3/2022 | Yang et al. | |
| 2022/0093895 | A1 * | 3/2022 | Zhang | H10K 50/844 |
| 2022/0158130 | A1 | 5/2022 | Hwang et al. | |

FOREIGN PATENT DOCUMENTS

| | | | |
|---|---|---|---|
| CN | 106601781 | A | 4/2017 |
| CN | 106711171 | A | 5/2017 |
| CN | 109037289 | A | 12/2018 |
| CN | 109301084 | A | 2/2019 |
| CN | 109585690 | A | 4/2019 |
| CN | 109742133 | A | 5/2019 |
| CN | 110416434 | A | 11/2019 |
| CN | 106601781 | B | 12/2019 |
| CN | 111009561 | A | 4/2020 |
| CN | 111710712 | A | 9/2020 |
| CN | 112002831 | A | 11/2020 |
| CN | 109585688 | B | 5/2021 |
| EP | 2960962 | A1 | 12/2015 |
| EP | 2960962 | B1 | 4/2020 |
| EP | 3671883 | A1 | 6/2020 |
| KR | 2019-0030951 | A | 3/2019 |
| KR | 2019-0065757 | A | 6/2019 |

OTHER PUBLICATIONS

Ma et al., WO 2021/147851, Jul. 29, 2021 (Year: 2021).*

International Search Report and Written Opinion mailed on Jul. 1, 2022, in corresponding PCT/CN2022/095329, 12 pages.

First Office Action mailed on Aug. 7, 2026, received for CN Application 202280001468.5, 15 pages including English Translation.

* cited by examiner

DISPLAY PANEL AND DISPLAY DEVICE

CROSS-REFERENCE TO RELATED APPLICATION

The present application is the U.S. National Stage of International Application No. PCT/CN2022/095329, filed on May 26, 2022, the contents of which are incorporated herein by reference in their entireties for all purposes.

TECHNICAL FIELD

The present disclosure relates to the field of display technology, and in particular to a display panel and a display device.

BACKGROUND

According to market demands, more and more consumers have higher and higher requirements for the bezel of the display device, and pursue an extremely narrow bezel.

Currently, when the display panel is encapsulated, a plurality of blocking dams are usually provided in a non-display area to prevent spillage of an organic encapsulation layer, which increases the width of the non-display area.

It is to be noted that the information disclosed in the above background section is only used to enhance the understanding of the background of the present disclosure, and thus may include information that does not constitute prior art known to those ordinary skilled in the art.

SUMMARY

An object of the present disclosure is to overcome the above deficiencies in the related arts and to provide a display panel and a display device.

According to a first aspect of the present disclosure, a display panel is provided. The display panel is provided with a display area and a non-display area connected to the display area, and the display panel includes a substrate, a first lead line, a blocking dam, an encapsulation layer. The first lead line is located at one side of the substrate, and extending from the display area to the non-display area. The blocking dam is located in the non-display area and surrounding the display area. The blocking dam includes an insulation layer group, and the insulation layer group is located at one side of the first lead line away from the substrate. A groove is provided at one side of the insulation layer group away from the substrate, and a depth of the groove is less than a thickness of the insulation layer group. The encapsulation layer is located at one side of the blocking dam away from the substrate. The encapsulation layer includes an organic encapsulation layer, and an orthographic projection of an edge of the organic encapsulation layer, away from the display area, on the substrate is located within an orthographic projection of the blocking dam on the substrate.

In one embodiment of the present disclosure, the groove includes a plurality of groove branches parallel to each other. The plurality of the groove branches are located at one side of the blocking dam close to the display area. A convex body is formed at one side of the plurality of the groove branches away from the display area. A plurality of convex branches are formed among the plurality of the groove branches, and the convex branch intersects with the convex body.

In one embodiment of the present disclosure, an angle of 20-30 degrees is formed between the convex branch and the convex body.

In one embodiment of the present disclosure, a width of the convex body is ⅙-⅓ of a width of the blocking dam. A width of the convex branch is ⅓-½ of the width of the blocking dam. A distance between two adjacent convex branches is ⅙-5⁄12 of the width of the blocking dam.

In one embodiment of the present disclosure, along a thickness direction of the display panel, a width of the convex branch is gradually reduced from one side of the convex branch close to the substrate to one side of the convex branch away from the substrate.

In one embodiment of the present disclosure, one surface of the convex branch close to the display area is an inclined surface inclined in a direction away from the display area, and one surface of the convex body close to the display area is an inclined surface inclined in a direction away from the display area.

In one embodiment of the present disclosure, the groove is located in a middle portion of the blocking dam. The groove includes a groove body and a plurality of groove branches. The groove body is provided along an extension direction of the blocking dam. The plurality of the groove branches are located at one side of the groove body close to the display area. The plurality of the groove branches communicate with the groove body.

In one embodiment of the present disclosure, the plurality of the groove branches are parallel to each other, and an angle of 20-60 degrees is formed between the groove branch and the groove body.

In one embodiment of the present disclosure, a width of the convex body is ⅙-⅓ of a width of the blocking dam. A width of the convex branch is ⅓-½ of the width of the blocking dam. A distance between two adjacent convex branches is ⅙-5⁄12 of the width of the blocking dam.

In one embodiment of the present disclosure, the groove is located in a middle portion of the blocking dam. A width of the groove is gradually increased from one side of the groove close to the substrate to one side of the groove away from the substrate.

In one embodiment of the present disclosure, a width of the groove is ⅓-7⁄12 of a width of the blocking dam.

In one embodiment of the present disclosure, the depth of the groove is equal to the depth of the groove is equal to a thickness of the third insulation layer, or a sum of a thickness of the second insulation layer and a thickness of the third insulation layer.

In one embodiment of the present disclosure, a width of the blocking dam is 50 um~80 um.

In one embodiment of the present disclosure, the groove includes a plurality of groove segments spaced along an extension direction of the blocking dam. The display panel further includes a second lead line, located at one side of the encapsulation layer away from the substrate and located between two adjacent groove segments.

In one embodiment of the present disclosure, a distance between two adjacent groove segments is 30 um~100 um.

In one embodiment of the present disclosure, the display panel further includes a first planarization layer and a pixel definition layer. The first planarization layer is located at the one side of the first lead line away from the substrate and located in the display area. The pixel definition layer is located at one side of the first planarization layer away from the substrate. The insulation layer group includes a first insulation layer and a third insulation layer sequentially arranged in a direction away from the substrate The first insulation layer is provided in a same layer and formed in a same material as the first planarization layer, The third insulation layer is provided in a same layer and formed in a same material as the pixel definition layer.

In one embodiment of the present disclosure, the display panel further includes a second planarization layer, located between the first planarization layer and the pixel definition layer. The insulation layer group further includes a second insulation layer. The second insulation layer is located between the first insulation layer and the third insulation layer, and the second insulation layer is provided in a same layer and formed in a same material as the second planarization layer.

In one embodiment of the present disclosure, the non-display area includes a binding region and a frame region. The binding region is located at one side of the display area. The binding region is provided with one blocking dam. The frame region is located at another side of the display area. A plurality of blocking dams are sequentially provided, along a direction away from the display area, in the frame region.

In one embodiment of the present disclosure, the groove is located at one side of the insulation layer group, of the blocking dam in the binding region, away from the substrate.

According to another aspect of the present disclosure, a display device is provided. The display device includes the display panel according to the first aspect of the present disclosure.

It should be understood that the general description above and the detailed description in the following text are only illustrative and explanatory, and do not limit the present disclosure.

BRIEF DESCRIPTION OF THE DRAWINGS

The accompanying drawings herein are incorporated into the specification and form a part of the specification, illustrating embodiments in accordance with the present disclosure, and are used in conjunction with the specification to explain the principles of the present disclosure. Obviously, the accompanying drawings in the following descriptions are only some embodiments of the present disclosure. For those ordinary skilled in the art, other accompanying drawings may be obtained based on these accompanying drawings without any creative labor.

DESCRIPTIONS OF REFERENCE NUMBERS

Figure 1:
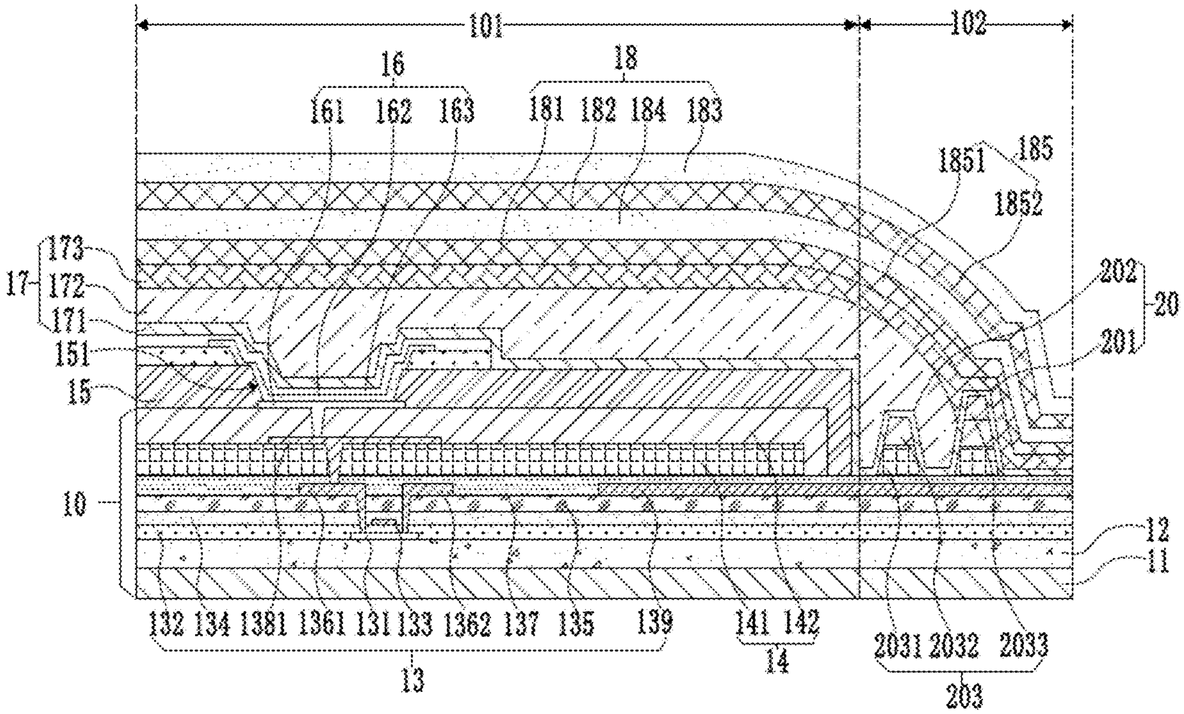
FIG. 1 is a cross-sectional structure diagram of a display panel according to one embodiment of the present disclosure.

101—display area, 102—non-display area, 1021—binding region, 1022—bezel region;
10—driving backplane, 11—substrate, 12—buffer layer;
13—driving circuit layer, 131—active layer, 132—gate insulation layer, 133—gate, 134—interlayer insulation layer, 135—interlayer dielectric layer, 1361—first source, 1362—drain, 137—protection layer, 1381—second source, 139—data line;
14—planarization layer group, 141—first planarization layer, 142—second planarization layer;
15—pixel definition layer, 151—pixel opening;
16—pixel layer, 161—pixel electrode, 162—light-emitting layer, 163—common electrode;
17—encapsulation layer, 171—first inorganic encapsulation layer, 172—organic encapsulation layer, 173—second inorganic encapsulation layer;
18—touch sensing control layer, 181—first touch sensing control layer, 1811—touch control driving metal mesh, 1812—touch control sensing metal mesh, 182—second touch sensing control layer, 183—second passivation layer, 184—first passivation layer, 185—touch control signal line, 1851—first part, 1852—second part;
20—blocking dam, 201—second blocking dam, 202—first blocking dam;
203—insulation layer group, 2031—first insulation layer, 2032—second insulation layer, 2033—third insulation layer;
204—groove, 2040—groove segment, 2041—groove body, 2042—groove branch;
205—convex body, 206—convex branch.

DETAILED DESCRIPTION

Illustrative embodiments will now be described more comprehensively with reference to the accompanying drawings. However, the illustrative embodiments may be implemented in multiple forms, which should not be limited to the illustrative embodiments set forth herein. On the contrary, providing these embodiments makes the present disclosure more comprehensive and complete, and comprehensively conveys the concept of the illustrative embodiments to those skilled in the art. The same reference numerals in the drawings represent the same or similar structures, therefore their detailed descriptions will be omitted. In addition, the accompanying drawings are only schematic illustrations of the present disclosure and are not necessarily drawn to scale.

Although relative terms such as "up" and "down" are used in the specification to describe the relative relationship between one component and another component shown in the drawings, these terms are only used for convenience in the specification, for example, according to the direction of the examples described in the accompanying drawings. It can be understood that if the device shown in the drawings is flipped so that it is upside down, the component described as "up" will become the component described as "down". When a certain structure is provided "on" another structure, it may refer to the certain structure being formed on the another structure as a whole, or the certain structure being "directly" provided on the another structure, or the certain structure being "indirectly" provided on the another structure through yet another structure.

The terms "one", "a", "this", "the", and "at least one" are used to indicate the existence of one or more elements/components, etc. The terms "include" and "provided with" are used to indicate open inclusion and refer to the possible existence of other elements/components, etc., in addition to the listed ones. The terms "first", "second", and "third" are only used as markers, which are not limitations to the quantity of their objects.

As shown in FIG. 1, a display panel may generally include a substrate 11, a driving circuit layer 13, a planarization layer group 14, and a pixel layer 16. The driving circuit layer 13 is located at one side of the substrate 11. The planarization layer group 14 is located at one side of the driving circuit layer 13 away from the substrate 11. The pixel layer 16 is located at one side of the planarization layer group 14 away from the substrate 11. In addition, the display panel may further include a buffer layer 12, and the buffer layer 12 is located between the substrate 11 and the driving circuit layer 13.

The substrate 11 may be an inorganic substrate or an organic substrate. For example, in one embodiment of the present disclosure, the material of the substrate 11 may be a glass material such as soda-lime glass, quartz glass, and sapphire glass; or the material of the substrate 11 may be a metal material such as stainless steel, aluminum, and nickel.

In another embodiment of the present disclosure, the substrate 11 may also be a flexible substrate, for example, the material of the substrate 11 may be polyimide (PI). The substrate 11 may also be a composite of multi-layer materials. For example, in one embodiment of the present disclosure, the substrate 11 may include a bottom film layer, a pressure-sensitive adhesive layer, a first polyimide layer and a second polyimide layer, which are sequentially stacked.

In the present disclosure, the driving circuit layer 13 is provided with a driving circuit for driving subpixels. In the driving circuit layer 13, any driving circuit may include a transistor and a storage capacitor. Furthermore, the transistor may be a thin film transistor. The thin film transistor may be selected from a top gate thin film transistor, a bottom gate thin film transistor, or a double gate thin film transistor. Taking the top gate thin film transistor as an example, the driving circuit layer 13 may include an active layer 131, a gate insulation layer 132, a gate 133, and a first source drain metal layer.

The active layer 131 is located at one side of the substrate 11 and is located in a display area 101. The material of the active layer 131 may be amorphous silicon semiconductor materials, low-temperature polycrystalline silicon semiconductor materials, metal oxide semiconductor materials, organic semiconductor materials or other types of semiconductor materials. The thin film transistor may be either N-type or P-type. The active layer 131 may include a channel region and two doping regions of different doping types located at both sides of the channel region.

The gate insulation layer 132 may cover the active layer 131 and the substrate 11. The gate insulation layer 132 is made of insulation materials such as silicon oxide.

The gate 133 is located in the display area 101. The gate 133 is located at one side of the gate insulation layer 132 away from the substrate 11 and is directly opposite to the active layer 131, that is, a projection of the gate 133 on the substrate 11 is within a range of a projection of the active layer 131 on the substrate 11. For example, the projection of the gate 133 on the substrate 11 coincides with a projection of the channel region of the active layer 131 on the substrate 11.

The driving circuit layer 13 further includes an interlayer insulation layer 134. The interlayer insulation layer 134 covers the gate 133 and the gate insulation layer 132. The driving circuit layer 13 further includes an interlayer dielectric layer 135. The interlayer dielectric layer 135 is located at one side of the interlayer insulation layer 134 away from the substrate 11. The interlayer insulation layer 134 and the interlayer dielectric layer 135 are both insulation materials, but the materials of the interlayer insulation layer 134 and the interlayer dielectric layer 135 may be different.

The first source drain metal layer is located on the surface of the interlayer dielectric layer 135 away from the substrate 11. The first source drain metal layer includes a first source 1361 and a drain 1362. The first source 1361 and the drain 1362 are located in the display area 101 and connected to the active layer 131. For example, the first source 1361 and the drain 1362 are respectively connected to the corresponding doping region of the two doping regions of the active layer 131 through a via.

A protection layer 137 is provided at one side of the first source drain metal layer away from the substrate 11. The protection layer 137 covers the first source drain metal layer. A planarization layer group 14 is located at one side of the first source drain metal layer away from the substrate 11. The planarization layer group 14 is located at one side of the protection layer 137 away from the substrate 11, and the planarization layer group 14 covers the protection layer 137. The surface of the planarization layer group 14 away from the substrate 11 is a plane.

Specifically, the planarization layer group 14 may include a first planarization layer 141. The first planarization layer 141 covers the protection layer 137. The display panel may further include a second source drain metal layer. A second planarization layer 142 is located at one side of the second source drain metal layer away from the substrate 11. The second planarization layer 142 covers one side of the second source drain metal layer away from the substrate 11 and one side of the first planarization layer 141 away from the substrate 11. The second source drain metal layer includes a second source 1381. The second source 1381 is connected to the first source 1361 through a via.

It should be noted that the driving circuit layer 13 further includes a first lead line. The first lead line may include a data line 139. The data line 139 is located in the same layer as the first source 1361, the drain 1362, or the second source 1381 in the array substrate. It should be noted that the first lead line extends from the display area to the non-display area.

A pixel definition layer 15 and a pixel layer 16 may be provided at one side of the planarization layer group 14 away from the substrate 11. The pixel definition layer 15 and the pixel layer 16 are located in the display area 101. The pixel definition layer 15 is provided with a plurality of pixel openings 151. The pixel layer 16 includes a plurality of subpixels. The plurality of the subpixels are located in the plurality of the pixel openings 151 respectively. The plurality of the subpixels are located at one side of the driving backplane 10 away from the substrate 11 and arranged in an array. Specifically, the subpixels may be located at one side of the planarization layer group 14 away from the substrate 11. It should be noted that the subpixels may include red subpixels, green subpixels, and blue subpixels, based on the different emission colors.

The pixel layer 16 may include a plurality of pixel electrodes 161, a light-emitting layer 162, and a common electrode 163. The pixel electrode 161 is located on the surface of the driving backplane 10 away from the substrate 11. The light-emitting layer 162 is located on the surface of the pixel electrode 161 away from the substrate 11. The common electrode 163 is located on the surface of the light-emitting layer 162 away from the substrate 11.

The pixel electrode 161 is connected to the first source 1361 or the second source 1381. When the driving circuit layer 13 only includes the first source 1361 and the first planarization layer 141, the pixel electrode 161 is connected to the first source 1361 through a via on the first planarization layer 141, and the pixel definition layer 15 is provided to cover the first electrode 161 and the first planarization layer 141. When the driving circuit layer 13 further includes a second source drain metal layer and a second planarization layer 142, the pixel electrode 161 is connected to the second source 1381 through a via on the second planarization layer 142, and the pixel definition layer 15 is provided to cover the second source drain metal layer and the second planarization layer 142.

The common electrode 163 may serve as a cathode, and the pixel electrode 161 may serve as an anode. The pixel electrode 161 is connected to the positive electrode of the power supply, and the common electrode 163 is connected to the negative electrode of the power supply. A signal may be applied through the pixel electrode 161 and the common electrode 163 to drive the light-emitting layer 162 to emit light to display the image. The specific light-emitting principle will not be detailed here. The light-emitting layer 162 may include an electroluminescent organic material, for example, the light-emitting layer 162 may include an auxiliary layer and a light-emitting material layer sequentially stacked on the pixel electrode 161. Generally, a pattern area is provided on the mask plate, and the auxiliary layer for subpixels of different colors and the light-emitting layer 163 for subpixels of different colors are formed through processes such as evaporation and plating.

In addition, the display panel of the present disclosure may further include an encapsulation layer 17. The encapsulation layer 17 is located at one side of the pixel layer 16 away from the substrate 11, thereby coating the pixel layer 16 to prevent water and oxygen erosion. The encapsulation layer 17 may be a single-layer or multi-layer structure. The material of the encapsulation layer 17 may include organic or inorganic materials, and no special limitations are made herein.

In this embodiment, the encapsulation layer 17 may include a first inorganic encapsulation layer 171, an organic encapsulation layer 172, and a second inorganic encapsulation layer 173. The first inorganic encapsulation layer 171 is located at one side of the pixel layer 16 away from the substrate 11. The organic encapsulation layer 172 is located at one side of the first inorganic encapsulation layer 171 away from the substrate 11. The second inorganic encapsulation layer 173 is located at one side of the organic encapsulation layer 172 away from the substrate 11.

Due to the flow of the liquid organic encapsulation material, it is easy for the liquid organic encapsulation material to spill. In order to prevent the spillage of the organic encapsulation material, especially at the lower bezel position, a plurality of blocking dams 20 have been installed sequentially in a direction away from the display area 101, in the non-display area 102. The plurality of the blocking dams 20 are used to play a multiple blocking role.

Taking two blocking dams 20 as an example, the blocking dams 20 are located at one side of the protection layer 137 away from the substrate 11, and include a first blocking dam 202 and a second blocking dam 201. The first blocking dam 202 surrounds the display area 101. The second blocking dam 201 surrounds the first blocking dam 202. The encapsulation layer 17 is provided at one side of the first blocking dam 202 away from the substrate 11 and one side of the second blocking dam 201 away from the substrate 11.

The stacking pattern of the first blocking dam 202 and the second blocking dam 201 includes an insulation layer group 203. The insulation layer group 203 is provided in a same layer and formed in a same material as one or more layers of the first planarization layer 141, the second planarization layer 142, and the pixel definition layer 15.

The stacking pattern of the first blocking dam 202 and the stacking pattern of the second blocking dam 201 may be set to be the same. The stacking patterns of the first blocking dam 202 and the second blocking dam 201 both include the first insulation layer 2031, and the first insulation layer 2031 is provided in a same layer and formed in a same material as the first planarization layer 141. A second insulation layer 2032 may be further provided on the first insulation layer 2031, and the second insulation layer 2032 is provided in a same layer and formed in a same material as the second planarization layer 142. A third insulation layer 2033 may be further provided on the second insulation layer 2032, and the third insulation layer 2033 is provided in a same layer and formed in a same material as the pixel definition layer 15.

The stacking pattern of the first blocking dam 202 and the stacking pattern of the second blocking dam 201 may be set to be different. For example, the stacking pattern of the first blocking dam 202 includes the second insulation layer 2032 and the third insulation layer 2033, the second insulation layer 2032 is provided in the same layer and formed in the same material as the second planarization layer 142, and the third insulation layer 2033 is provided in the same layer and formed in the same material as the pixel definition layer 15. The stacking pattern of the second blocking dam 201 includes the first insulation layer 2031, the second insulation layer 2032, and the third insulation layer 2033. The first insulation layer 2031 is provided in the same layer and formed in the same material as the first planarization layer 141, the second insulation layer 2032 is provided in the same layer and formed in the same material as the second planarization layer 142, and the third insulation layer 2033 is provided in the same layer and formed in the same material as the pixel definition layer 15.

Due to the fact that the first blocking dam 202 lacks the film pattern of the first insulation layer 2031 compared to the second blocking dam 201, the height of the first blocking dam 202 relative to the substrate 11 is lower than that of the second blocking dam 201 relative to the substrate 11. This lengthens the path for external water vapor and oxygen to enter the display area 101, increases the difficulty of entering the display area 101, and further improves the blocking capability of the blocking dam 20.

Although using the plurality of the blocking dams 20 for encapsulation can prevent the spillage of the organic encapsulation material and also have a good blocking effect, the larger the number of the blocking dams 20, the wider the area occupied by the blocking dams 20 in the non-display area 102, resulting in a larger width of the non-display area 102 of the display panel.

The display area 101 further includes a touch sensing control layer 18. The touch sensing control layer 18 may be a mutual capacitive touch sensing control. The touch sensing control layer 18 includes a first touch sensing control layer 181 and a second touch sensing control layer 182. The first touch sensing control layer 181 may be a metal mesh layer (MM), and the second touch sensing control layer 182 may be a bridge metal layer (BM). The first touch sensing control layer 181 may also be a bridge metal layer (BM), and the second touch sensing control layer 182 may be a metal mesh layer (MM). In the following, the metal mesh layer (MM) is used as the first touch sensing control layer 181, and the bridge metal layer (BM) is used as the second touch sensing control layer 182 for explanation. The first touch sensing control layer 181 is located in the display area 101, and may be divided into touch control driving metal mesh 1811 and touch control sensing metal mesh 1812 according to the horizontal and vertical direction. One of the touch control sensing metal mesh 1812 and the touch control driving metal mesh 1811 is connected to each other, and the other is connected through the second touch sensing control layer 182. A first passivation layer 184 is provided at one side of the first touch sensing control layer 181 away from the substrate 11, and a second passivation layer 183 is provided at one side of the second touch sensing control layer 182 away from the substrate 11.

In the non-display area 102, a second lead line is provided at one side of the second inorganic encapsulation layer 173 away from the substrate 11. The second lead line may be a touch control signal line 185. A plurality of the touch control signal lines 185 are electrically connected in correspondence with the touch control driving metal mesh 1811 and the touch control sensing metal mesh 1812, respectively. The touch control signal lines 185 may include a first part 1851 provided in the same layer as the metal mesh layer MM, and a second part 1852 provided in the same layer as the bridge metal layer BM and electrically connected to the first part 1851.

By setting the touch control signal lines 185 as the double-layer wires including the first part 1851 and the second part 1852, it is possible to load the touch control signals to the metal mesh layer MM through the other layer wire after a partial breakage of one of the double-layer wires, so as to effectively solve the problem that the breakage of a single-layer wire is likely to lead to a failure of the touch control. Furthermore, compared with the design of a single-layer wire, the double-layer wire may also reduce the resistance value of the touch control signal lines 185. In specific implementation, the first part 1851 is electrically connected to the second part 1852 through a via which passes through the inorganic insulation layer.

However, the touch control signal lines 185 are usually provided between the blocking dam 20 and the edge of the display area, but the width of this area is limited. To set all of the touch control signal lines 185, the width of this area is required, which will increase the width of the non-display area of the display panel.

Based on this, one embodiment of the present disclosure provides a display panel. As shown in FIGS. 2 to 12, the display panel is provided with a display area 101 and a non-display area 102 connected to the display area 101. The display panel includes a substrate 11, a first lead line, a blocking dam 20, and an encapsulation layer 17. The first lead line is located at one side of the substrate 11, and extending from the display area 101 to the non-display area 102. The blocking dam 20 is located in the non-display area 102 and surrounding the display area 101. The blocking dam 20 includes an insulation layer group 203. The insulation layer group 203 is located at one side of the first lead line away from the substrate 11. A groove 204 is provided at one side of the insulation layer group 203 away from the substrate 11. A depth of the groove 204 is less than a thickness of the insulation layer group 203. The encapsulation layer 17 is located at one side of the blocking dam 20 away from the substrate 11. The encapsulation layer 17 includes an organic encapsulation layer 172. An orthographic projection of an edge of the organic encapsulation layer 172, away from the display area 101, on the substrate 11 is located within an orthographic projection of the blocking dam 20 on the substrate 11.

The blocking dam 20 includes the insulation layer group 203, and the groove 204 is provided at one side of the insulation layer group 203 away from the substrate 11. After the liquid organic encapsulation material flows from the display area 101 to the highest point of the blocking dam 20, the excess liquid organic encapsulation material may directly fall into the groove 204, avoiding the excess liquid organic encapsulation material from flowing across the blocking dam 20 to the outside of the encapsulation area, causing that the orthographic projection of the edge of the organic encapsulation layer 172, away from the display area 101, on the substrate 11 is located within the orthographic projection of the blocking dam 20 on the substrate 11. The display panel includes only one blocking dam 20, and the width of the area, where the blocking dam 20 is provided, of the non-display area 102 decreases, thereby reducing the width of the entire non-display area 102.

Figure 2:
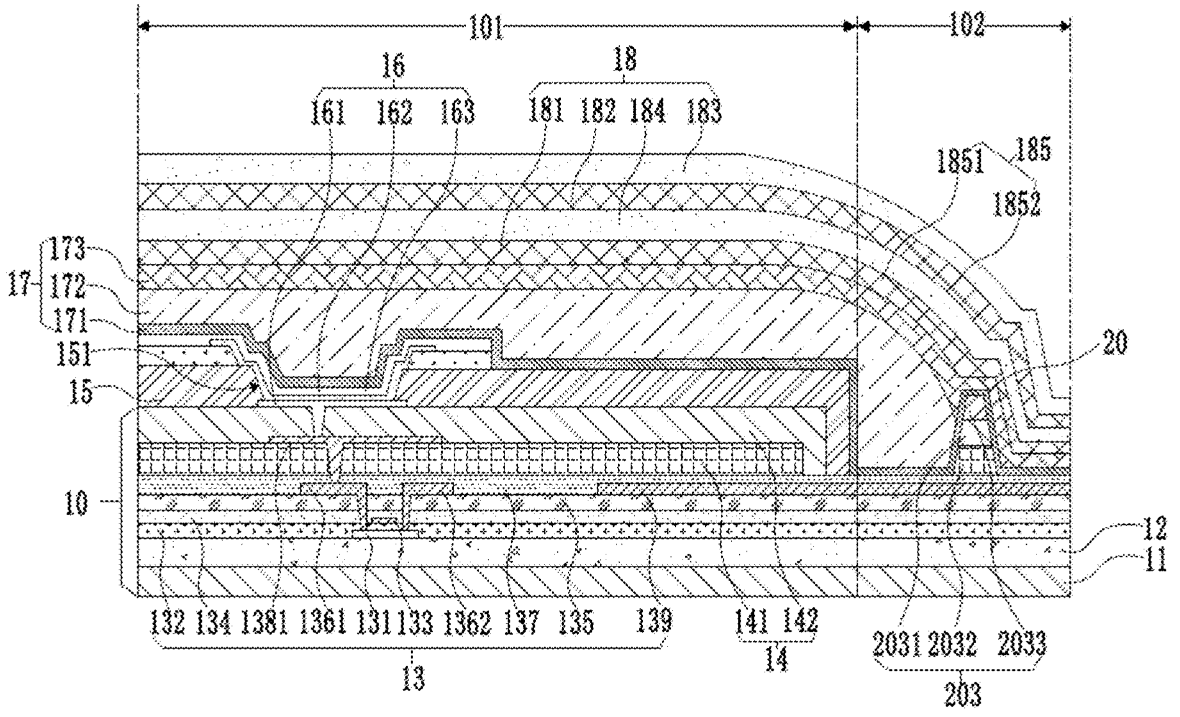
FIG. 2 is a cross-sectional structure diagram of another display panel according to one embodiment of the present disclosure.
Figure 3:
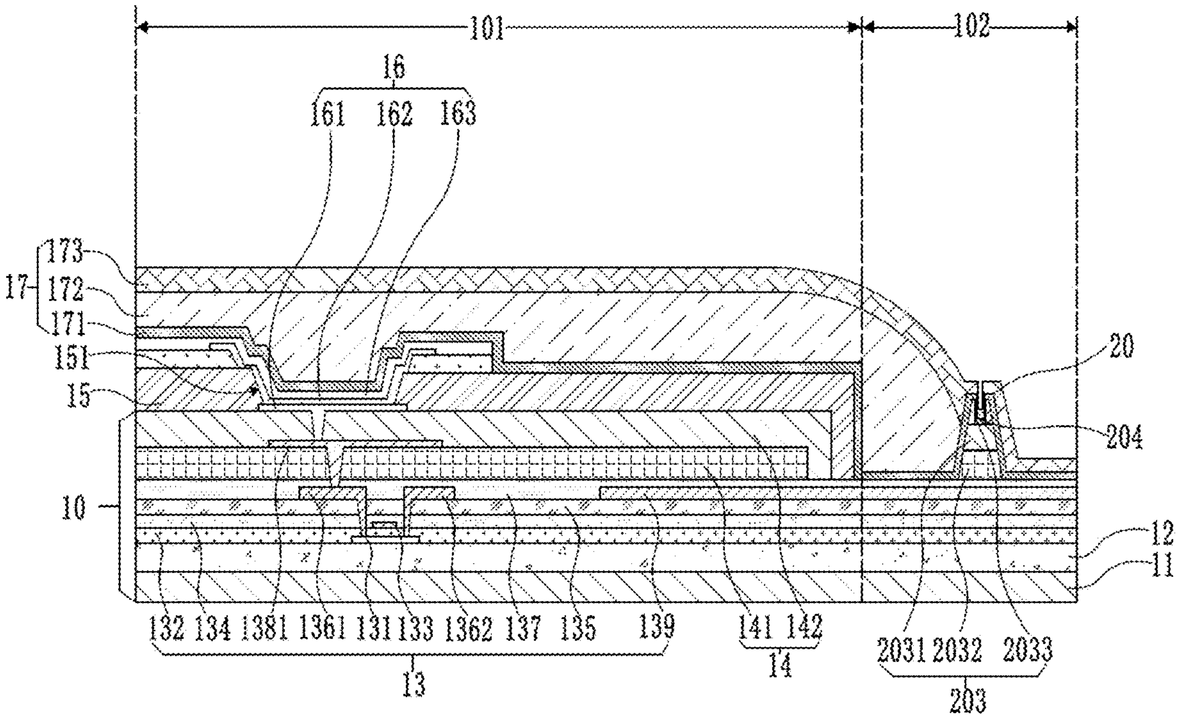
FIG. 3 is a partial cross-sectional structure diagram of another display panel according to one embodiment of the present disclosure.

As shown in FIGS. 2 and 3, the display area of this display panel is substantially the same as the display area of the display panel illustrated in FIG. 1, and thus will not be repeated. The difference is that the non-display area 102 of this display panel includes only one blocking dam 20, the blocking dam 20 includes an insulation layer group 203, the insulation layer group 203 includes a first insulation layer 2031, a second insulation layer 2032, and a third insulation layer 2033 sequentially arranged in a direction away from the substrate 11, the first insulation layer 2031 is provided in the same layer and formed in the same material as the first planarization layer 141, the second insulation layer 2032 is provided in the same layer and formed in the same material as the second planarization layer 142, the third insulation layer 2033 is provided in the same layer and formed in the same material as the pixel definition layer 15, and a groove 204 is provided at one side of the insulation layer group 203 away from the substrate 11. It is to be noted that the width of the blocking dam is from 50 um~80 um.

Figure 4:
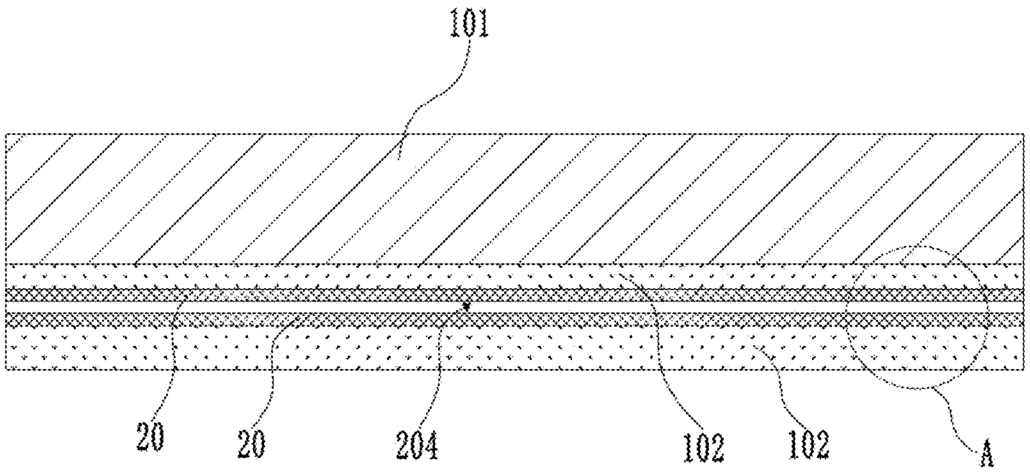
FIG. 4 is a schematic diagram of a blocking dam of another display panel according to one embodiment of the present disclosure.
Figure 5:
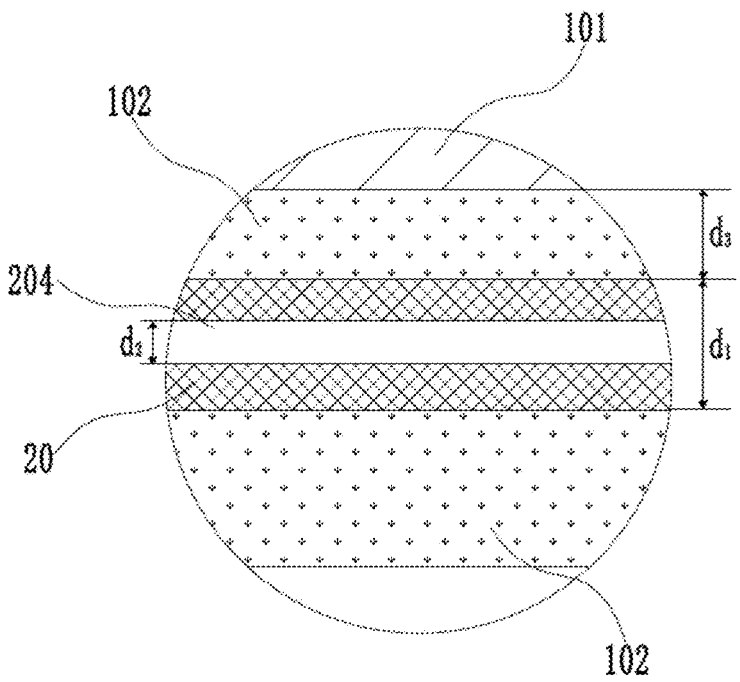
FIG. 5 is a partially enlarged diagram of part A in FIG. 4.

In this embodiment, the structure and arrangement manner of the groove are shown in FIGS. 4 and 5. Along a width direction of the blocking dam 20, the groove 204 is provided at one side of the insulation layer group 203 away from the substrate 11, the groove 204 is located in a middle portion of the blocking dam 20, and the distance between one of the groove walls of the groove 204 and one surface of the blocking dam 20 close to the display area 101 is equal to the distance between the other one of the groove walls, of the groove 204, opposite to the one groove wall, and another surface of the blocking dam 20 away from the display area 101. A length of the groove 204 is equal to a length of the blocking dam 20, a width d2 of the groove 204 is $\frac{1}{3}$-$\frac{7}{12}$ of a width d1 of the blocking dam 20, and a depth of the groove 204 is equal to a thickness of the third insulation layer 2033. The width d2 of the groove 204 is gradually increased from one side of the groove 204 close to the substrate 11 to one side of the groove 204 away from the substrate 11, i.e., along a thickness direction of the insulation layer group 203, the cross-section shape of the groove 204 is an inverted trapezoidal shape. It should be noted that the width direction of the blocking dam 20 is perpendicular to the extension direction of the blocking dam 20. It can allow the spilled liquid organic encapsulation material to fall directly into the groove 204, blocking the continued flow of the liquid organic encapsulation material. The distance d3 between the blocking dam 20 and the display area 101 is ½-¾ of the width d1 of the blocking dam 20.

In one example, the width d1 of the blocking dam 20 is set to be 60 um, the distance d3 between the blocking dam 20 and the display area 101 is 30 um-45 um, the width d2 of the groove 204 may be set to be 20 um-35 um, the depth of the groove 204 may be set to be 1.5 um~2.3 um, and the length of the groove 204 is consistent with the length of the blocking dam 20. More specifically, the width d2 of the groove 204 may be set to be 20 um, the depth of the groove 204 may be set to be 1.5 um~2.0 um, and the distance d3 between the blocking dam 20 and the display area 101 is 40 um.

It should be noted that the width of the groove 204 should not be too small. If the width of the groove 204 is too small, it is difficult to form a continuous recessed portion when the blocking dam 20 is patterning. Of course, the width of the groove 204 should not be too large. If the width of the groove 204 is too large, it may damage the structure of the blocking dam 20, causing the protrusions on both sides of the groove 204 to be removed during exposure and development, and failing to have the effect of blocking the organic encapsulation material.

Figure 6:
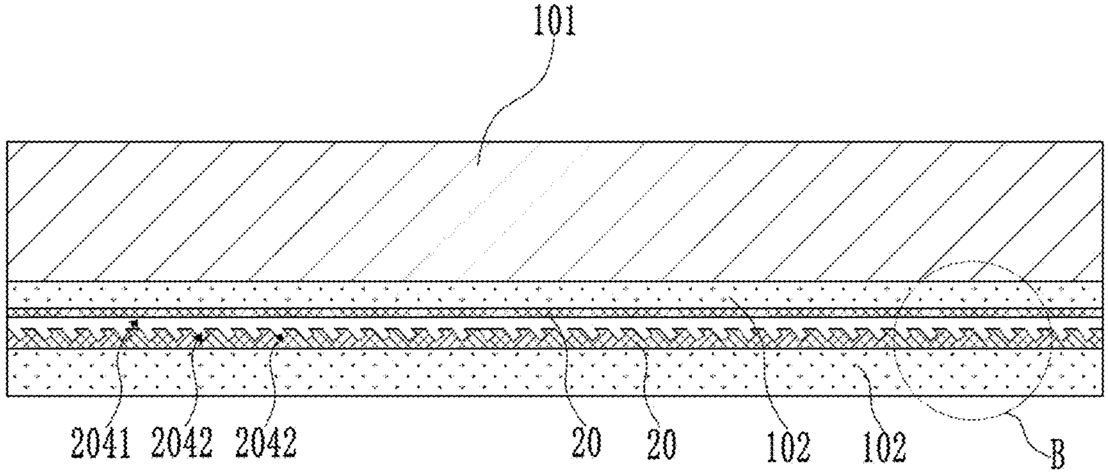
FIG. 6 is a schematic diagram of another blocking dam of another display panel according to one embodiment of the present disclosure.
Figure 7:
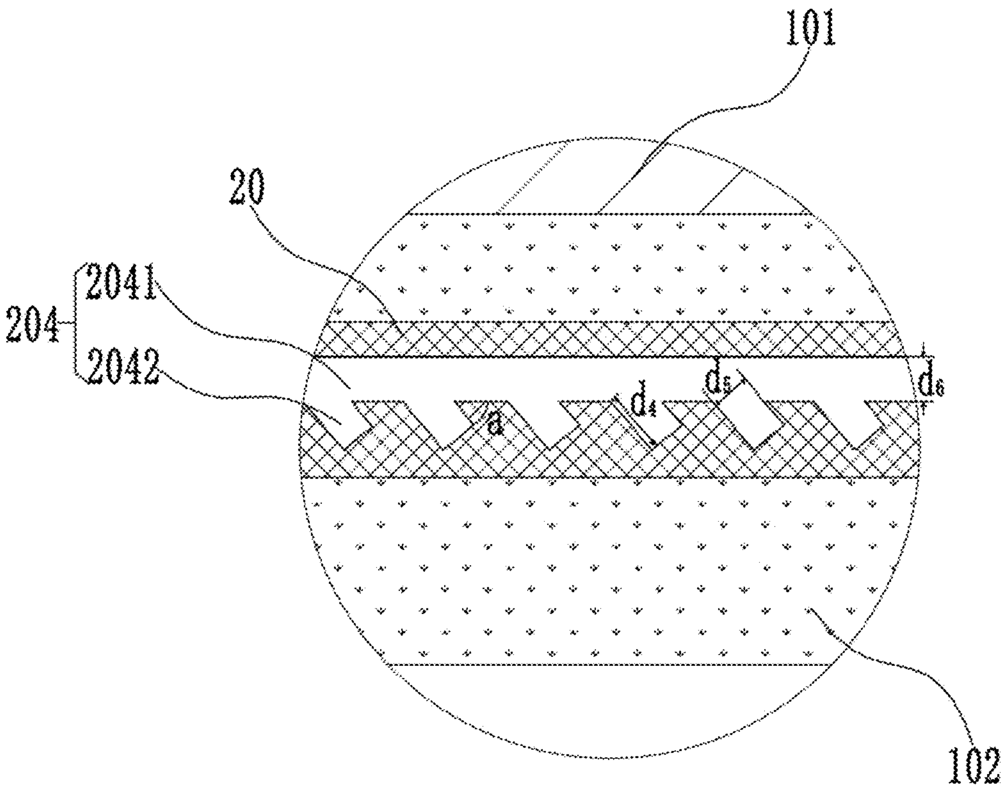
FIG. 7 is a partially enlarged diagram of part B in FIG. 6.

In this embodiment, the structure and arrangement manner of the groove is shown in FIGS. 6 and 7. Along the width direction of the blocking dam 20, the groove 204 is located in the middle portion of the blocking dam 20. The groove 204 includes a groove body 2041 and a plurality of groove branches 2042. The groove body 2041 is provided along an extension direction of the blocking dam 20, the plurality of the groove branches 2042 are located at one side of the groove body 2041 away from the display area 101, and the plurality of the groove branches 2042 communicate with the groove body 2041. The plurality of the groove branches 2042 are parallel to each other, and an angle of 20-60 degrees is formed between the groove branch 2042 and the groove body 2041.

By forming the groove body 2041 and the groove branches 2042 at one side of the insulation layer group 203 away from the substrate 11, the first inorganic encapsulation layer 171 may form a recess corresponding to the groove branches 2042 and the groove body 2041. When the organic encapsulation layer 172 is formed, the recess corresponding to the groove branches 2042 may disrupt the equilibrium state of the surface tension of the liquid organic material. Under the action of capillary effect, the liquid organic material may diffuse along the recess corresponding to the groove branches 2042 towards the recess corresponding to the groove body 2041, until the liquid organic material is blocked by one side, of the recess corresponding to the groove body, away from the display area 101, and this may prevent the problem of spillage of the organic material due to the inability to accurately control the flow boundary of the organic material, and avoid the spillage of the organic material which may cause the organic material to contact with external water and oxygen and lead to failure of the encapsulation.

The groove body 2041 is a bar-shaped groove 204 provided along the extension direction of the blocking dam 20. A length of the groove body 2041 is equal to a length of the blocking dam 20, a width d6 of the groove body 2041 remains consistent in the extension direction of the groove body 2041, and a width d6 of the groove body 2041 is equal to ⅙-¼ of a width d1 of the blocking dam 20. The groove branches 2042 are bar-shaped grooves 204 inclined to be provided at one side of the groove body 2041 close to the display area 101, and the groove branches 2042 communicate with the groove body 2041. The groove branch 2042 extends along its inclined direction, the angle a between the groove branch 2042 and the groove body 2041 is 20-60 degrees, the length d4 of the groove branch 2042 is of ⅙-½ of the width d1 of the blocking dam 20 d1, and the width d5 of the groove branch 2042 is ⅙-5/12 of the width d1 of the blocking dam 20.

It is to be noted that the depth of the groove body 2041 and the depth of the groove branch 2042 remain the same in the extension direction of the blocking dam 20 and in the width direction of the blocking dam 20, both equal to the thickness of the third insulation layer 2033.

In one example, the width d1 of the blocking dam 20 is set to be 60 um, and the distance between the blocking dam 20 and the edge of the pixel definition layer 15 is 30 um-45 um. The width d6 of the groove body 2041 may be set to be 10 um-15 um, and the length of the groove body 2041 is equal to the length of the blocking dam 20. The groove branches 2042 are provided at one side of the groove body 2041 close to the display area 101, the angle a between the groove branch 2042 and the groove body 2041 is 45 degrees, the width d5 of the groove branch 2042 is 10 um-25 um, and the length d4 of the groove branch 2042 is 10 um-30 um. The depth of the groove body 2041 and the depth of the groove branch 2042 may both be set to be 1.5 um~2.3 um. More specifically, the width d6 of the groove body 2041 may be set to be 10 um, the length of the groove body 2041 is equal to the length of the blocking dam 20, the width d5 of the groove branch 2042 may be set to be 10 um, the length of the groove branch 2042 may be set to be 20 um, and the distance between the blocking dam 20 and the edge of the pixel definition layer 15 is 40 um.

Figure 8:
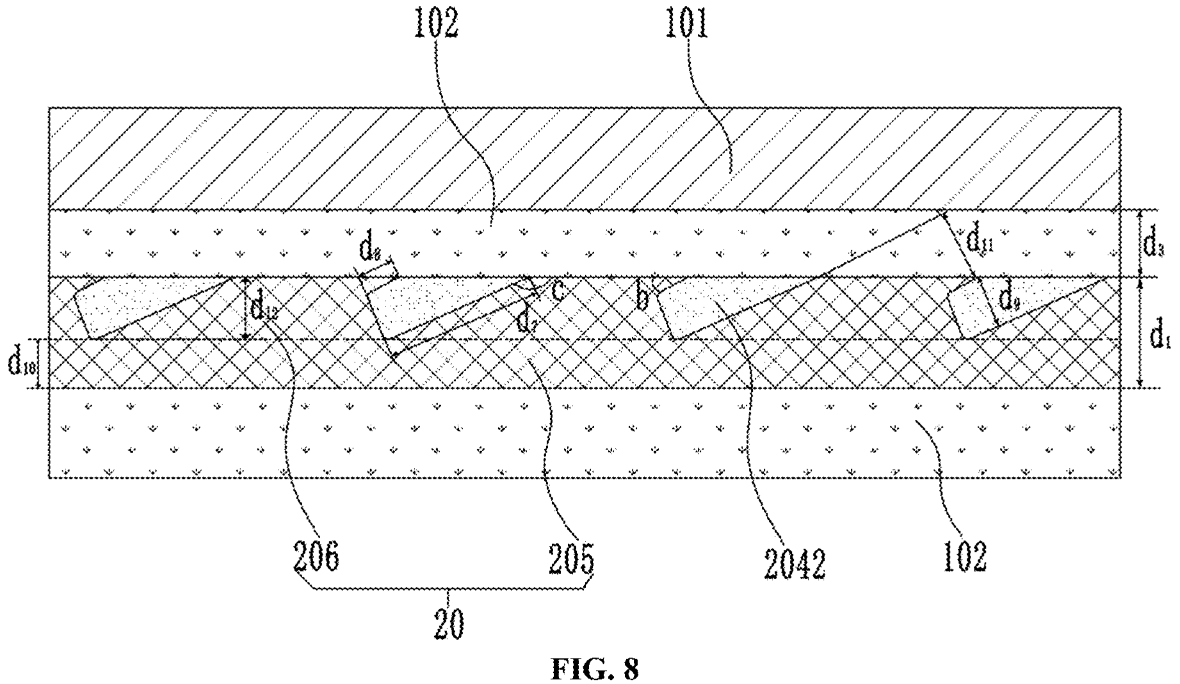
FIG. 8 is a schematic diagram of another blocking dam of another display panel according to one embodiment of the present disclosure.
Figure 9:
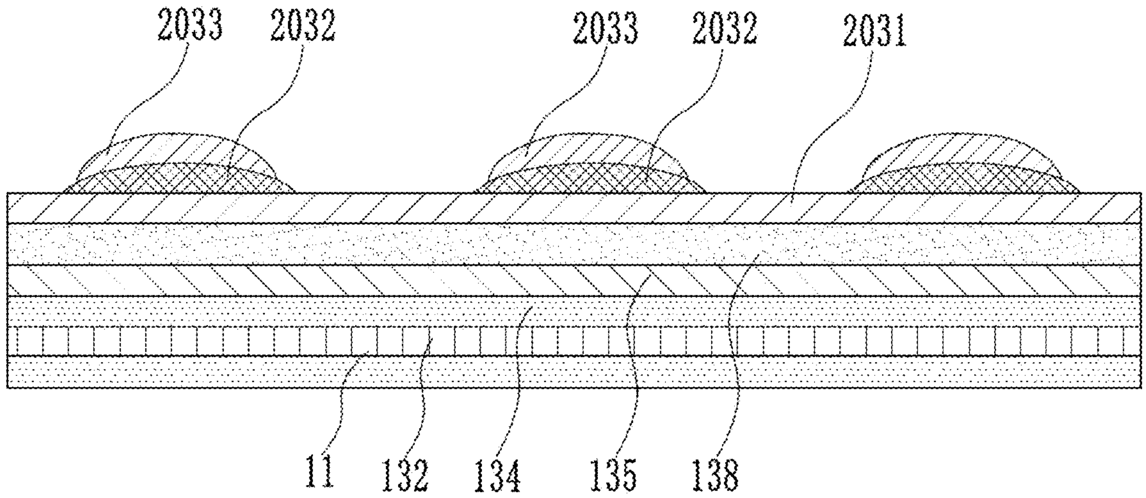
FIG. 9 is a cross-sectional diagram along C-C of FIG. 8.
Figure 10:
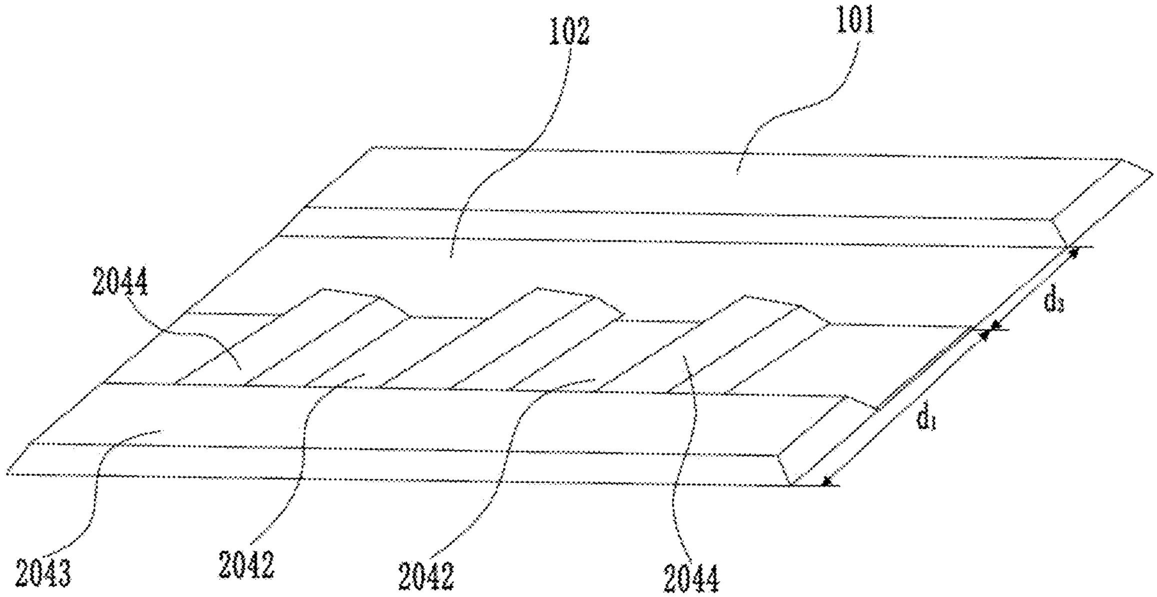
FIG. 10 is a partial stereogram of yet another blocking dam of another display panel according to one embodiment of the present disclosure.

In one embodiment, the structure and arrangement manner of the groove are shown in FIGS. 8 to 10. The groove 204 includes a plurality of groove branches 2042 parallel to each other, and the plurality of the groove branches 2042 are located at one side of the blocking dam 20 close to the display area 101. A convex body 205 is formed at one side of the plurality of the groove branches 2042 away from the display area 101, a plurality of convex branches 206 are formed among the plurality of the groove branches 2042, and the convex branch 206 intersects with the convex body 205. Specifically, an angle b of 20-30 degrees is formed between the convex branch 206 and the convex body 205.

By forming the convex body 205 and the convex branches 206 at one side of the insulation layer group 203 away from the substrate 11, the first inorganic encapsulation layer 171 may form a protrusion corresponding to the convex body 205 and the convex branches 206. When the organic encapsulation layer 172 is formed, the protrusion corresponding to the convex branches 206 may disrupt the equilibrium state of the surface tension of the liquid organic material. Under the action of capillary effect, the liquid organic material may diffuse along the protrusion corresponding to the convex branches 206 towards the protrusion corresponding to the convex body 205, until the liquid organic material is blocked by one side, of the protrusion corresponding to the convex body 205, close to the display area 101, and this may prevent the problem of spillage of the organic material due to the inability to accurately control the flow boundary of the organic material, and avoid the spillage of the organic material which may cause the organic material to contact with external water and oxygen and lead to failure of the encapsulation.

In addition, the groove branches 2042 are provided at one side of the blocking dam 20 close to the display area 101, and the formation of the convex body 205 and the convex branches 206 increases the contact area between the blocking dam 20 and the liquid organic material by approximately 162% compared to the case where one side of the blocking dam 20 close to the display area 101 is set as a plane. The increase in contact area between the liquid organic material and the blocking dam 20 may further delay the flow rate of the liquid organic material.

The parts where the convex body 205 and the convex branches 206 contact with the liquid organic material may be set as vertical planes. The parts where the convex body 205 and the convex branches 206 contact with the liquid organic material may also be set as inclined planes. In this embodiment, one side of the convex body 205 close to the display area 101 is an inclined plane inclined in a direction away from the display area 101. One side of the convex branch 206 close to the display area 101 is an inclined plane inclined in a direction away from the display area 101. Along a thickness direction of the display panel, the width of the convex branch 206 is gradually reduced from one side of the convex branch 206 close to the substrate 11 to one side of the convex branch 206 away from the substrate 11.

In the case of the thickness of the insulation layer and the depth of the groove 204 remaining unchanged, the contact area between the liquid organic material and the inclined plane is obviously larger than the contact area between the liquid organic material and the vertical plane. By setting the parts where the convex body 205 and the convex branches 206 contact with the liquid organic material as inclined planes, the contact area between the liquid organic material and the blocking dam 20 is further increased, which may further delay the flow rate of the liquid organic material on the basis of the above.

In this embodiment, a width d10 of the convex body 205 remains consistent in the extension direction of the groove body 2041. A width d10 of the convex body 205 is ⅙-⅓ of a width d1 of the blocking dam 20, a width d11 of the convex branch 206 is ⅓-½ of the width d1 of the blocking dam 20, and a distance between two adjacent convex branches 206 is ⅙-5/12 of the width d1 of the blocking dam 20.

For example, the width d1 of the blocking dam 20 is set to be 50 um, and the distance between the blocking dam 20 and the edge of the pixel definition layer 15 is 30 um-45 um. The width d10 of the convex body 205 is 10 um-20 um, the width d11 of the convex branch 206 is 20 um-30 um, and the distance d9 between two adjacent convex branches 206 is 10 um-25 um.

When the angle b between the convex branch 206 and the convex body 205 is 20 degrees, the distance d12 between one side of the convex branch 206 away from the convex body 205 and the convex body 205 is 30 um, and the width d11 of the convex branch 206 is 30 um. The convex branch 206 includes a horizontal edge, a first inclined edge, and a second inclined edge. The horizontal edge is provided close to the display area, and the first inclined edge and the second inclined edge are connected to one end of the horizontal edge, respectively. The first inclined edge and the second inclined edge are parallel to each other, forming an angle b between the first inclined edge and the horizontal edge, and an angle c, that complements the angle b, between the second inclined edge and the horizontal edge. The length d8 of the first inclined edge is 20 um, the length d7 of the second inclined edge is 85 um, and the distance between the blocking dam 20 and the edge of the pixel definition layer 15 is 30 um.

The width of the convex branch 206 located in the second insulation layer 2032 is 35 um, the width of the convex branch 206 located in the third insulation layer 2033 is 30 um, the distance between two adjacent convex branches 206 in the second insulation layer 2032 is 20 um, and the distance between two adjacent convex branches 206 in the third insulation layer 2033 is 25 um.

It can be understood that the distance between the blocking dam 20 of this structure and the display area 101 is shorter, which may further reduce the width of the non-display area 102, thereby making the frame of the display panel narrower.

It is to be noted that all dimensions involved in the structure of the blocking dam 20 are based on one side of the blocking dam 20 close to the substrate 11.

Figure 11:
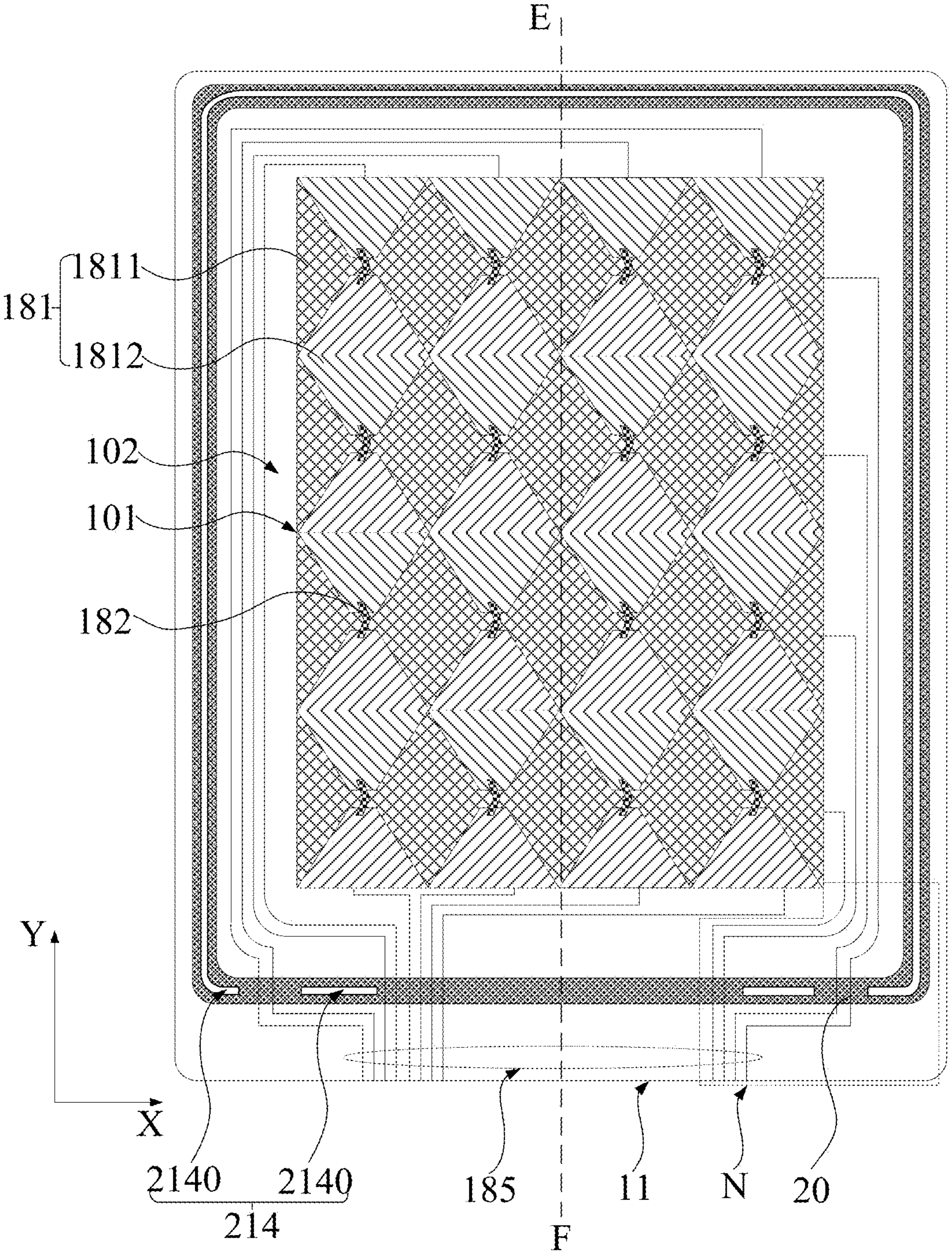
FIG. 11 is a schematic planar diagram of another display panel according to one embodiment of the present disclosure.
Figure 12:
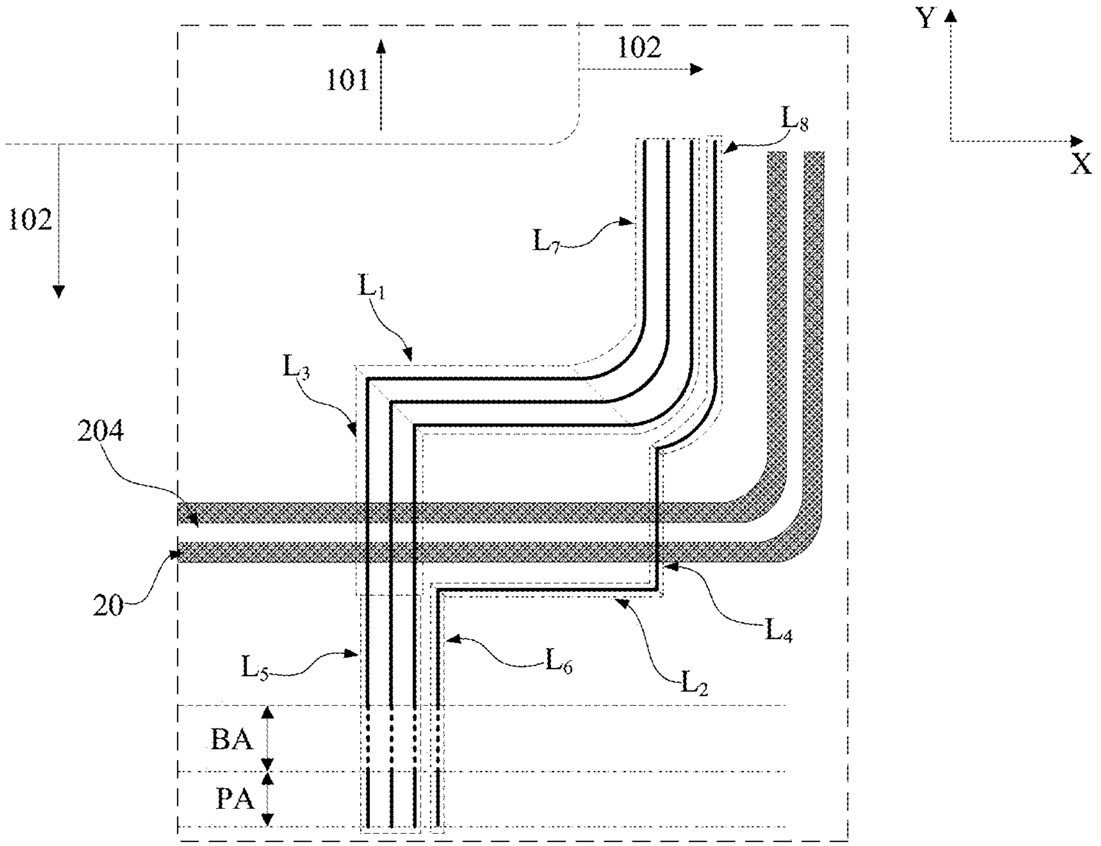
FIG. 12 is a partially enlarged diagram of part N in FIG. 11.

FIGS. 11 and 12 show a display panel. An encapsulation layer 17 is provided at one side of the blocking dam 20 away from the substrate 11, and a plurality of touch control signal lines 185 are provided at one side of the encapsulation layer 17 away from the substrate 11. The plurality of the touch control signal lines 185 may include: a plurality of first wires L1 and a plurality of second wires L2, which are parallel to the first direction X. Orthographic projections of the plurality of the first wires L1 on the substrate 11 are located between the an orthographic projection of the blocking dam 20 on the substrate 11 and the display area 101, and orthographic projections of the plurality of the second wires L2 on the substrate 11 are located at one side, of the orthographic projection of the blocking dam 20, away from the display area 101, on the substrate 11.

By placing the plurality of the first wires L1 in the non-display area 102 inside the blocking dam 20 and placing the plurality of the second wires L2 parallel to the first wires L1 in the non-display area 102 outside the blocking dam 20, the space outside the blocking dam 20 may be reasonably utilized, effectively reducing the width of the non-display area 102 inside the blocking dam 20, and facilitating the product demand for narrower frame design.

The plurality of the touch control signal lines 185 may further include: a plurality of third wires L3 and a plurality of fourth wires L4, which are parallel to the second direction Y. The second direction Y intersects with the first direction X. The third wires L3 and the first wires L1 are in one-to-one correspondence to form an integrated structure, and the fourth wires L4 and the second wires L2 are in one-to-one correspondence to form an integrated structure. Orthographic projections of the plurality of the third wires L3 and the plurality of the fourth wires L4 on the substrate 11 cross the orthographic projection of the blocking dam 20 on the substrate 11.

By setting the plurality of the third wires L3 and the plurality of the fourth wires L4 that cross the blocking dam 20, on the one hand, the first wires L1 at the inner side of the blocking dam 20 may be led out to the outer side of the blocking dam 20, which is conducive to connecting the touch control signal lines 185 with the external driving circuit. On the other hand, the second wires L2 at the outer side of the blocking dam 20 may be led out to the inner side of the blocking dam 20, which facilitates the electrical connection between the touch control signal lines 185 and the touch control driving metal mesh 1811 or the touch control sensing metal mesh 1812 in the display area 101.

The second lead line is located at one side of the encapsulation layer 17 away from the substrate 11, specifically at one side of the second inorganic encapsulation layer 173 away from the substrate 11. A recess may be formed at a position of the second inorganic encapsulation layer 173 corresponding to the groove 204. In order to prevent the second lead line from falling into the recess on the surface of the second inorganic encapsulation layer 173, the groove 204 includes a plurality of groove segments 2040 spaced along an extension direction of the blocking dam 20, and the second lead line is located between two adjacent groove segments 2040, which may eliminate the risk of uneven distribution of the second lead line caused by the unevenness of one side of the blocking dam 20 away from the substrate 11 when forming the second lead line, and the presence of residue between two adjacent second lead lines due to insufficient exposure. The presence of residue between two adjacent second lead lines results in the risk of short circuit caused by mutual contact between adjacent lead lines. Specifically, the distance between two adjacent groove segments 2040 is between 30 um and 100 um.

A bending area BA may also be provided at one side of the blocking dam 20 away from the display area 101. In this case, the orthographic projection of the second wire L2 on the substrate 11 may be located between the orthographic projection of the blocking dam 20 on the substrate 11 and the bending area BA. The orthographic projection of the third wire L3 on the substrate 11 may be located between the orthographic projection of the corresponding first wire L1 on the substrate 11 and the bending area BA. The orthographic projection of the fourth wire L4 on the substrate 11 may be located between the orthographic projection of the corresponding second wire L2 on the substrate 11 and the orthographic projection of the first wire L1 on the substrate 11. In other words, the third wire L3 extends from the first wire L1 of the integrated design to the bending zone BA, and the fourth wire L4 extends from the second wire L2 of the integrated design to the inner side of the blocking dam 20.

The non-display area 102 may further include a pad area PA located at one side of the bending area BA away from the blocking dam 20. The plurality of the touch control signal lines 185 may further include: a plurality of fifth wires L5 and a plurality of sixth wires L6, which are parallel to the second direction Y. The plurality of the fifth wires L5 and the plurality of the sixth wires L6 are arranged side by side at one side of the central axis of the second wires L2, adjacent to the substrate 11, in the second direction Y.

The fifth wire L5, the third wire L3, and the first wire L1 are in one-to-one correspondence to form an integrated structure. Through the third line L3, the fifth wire L5 is connected to one end of the first wire L1 adjacent to the central axis, and the fifth wire L5 extends through the bending area BA to the pad area PA. The sixth wire L6, the fourth wire L4, and the second wire L2 are in one-to-one correspondence to form an integrated structure. The fourth wire L4 is connected to one end of the second wire L2 away from the central axis, the sixth wire L6 is connected to one end of the second wire L2 adjacent to the central axis, and the sixth wire L6 extends through the bending area BA to the pad area PA.

The pad area PA is provided with a plurality of contact pads (also known as pads). Each of the contact pads is configured to electrically connect a fifth wire L5 or a sixth wire L6. The contact pad may be exposed to the surface of the pad area PA, that is, not covered by any layer, which facilitates electrical connection to the flexible printed circuit board. The flexible printed circuit board is electrically connected to an external controller and is configured to transmit signals or power from the external controller to the fifth wire L5 and the sixth wire L6.

The plurality of the touch control signal lines 185 may further include: a plurality of seventh wires L7 and a plurality of eighth wires L8, which are parallel to the second direction Y. The seventh wires L7 and the first wires L1 are in one-to-one correspondence to form an integrated structure, and the seventh wire L7 is connected to one end of the first wire L1 away from the central axis. The eighth wires L8 and the fourth wires L4 are in one-to-one correspondence to form an integrated structure, and the eighth wire L8 is connected to one side of the fourth wire L4 away from the second wire L2.

Due to the fact that one end of the first wire L1 away from the central axis is located in an adjacent non-display area 102 adjacent to the non-display area 102 where the plurality of the third wires L3 are located, the seventh wire L7 may extend in the second direction Y within the adjacent non-display area 102. In addition, due to the fact that one end of the fourth wire L4 away from the second wire L2 is located in an adjacent non-display area 102 adjacent to the non-display area 102 where the plurality of the third wires L3 are located, the eighth wire L8 may also extend in the second direction Y within the adjacent non-display area 102. This setting minimizes the wiring length of the touch control signal line 185, resulting in a smaller resistance value of the touch control signal line 185, and avoiding signal delay of the touch control signal line 185.

The plurality of the touch control signal lines 185 may be divided into two groups, and the two groups of the touch control signal lines 185 are symmetrically arranged about the central axis EF, of the substrate 11, in the second direction Y. Specifically, the wiring manners of the touch control signal lines 185 at both of the inner side and the outer side of the blocking dam 20 are the same at both sides of the central axis EF, of the substrate 11, in the second direction Y, but the specific number of the touch control signal lines 185 of the two groups is not limited. That is to say, the number of the touch control signal lines 185 of the two groups may be the same or different. This setting facilitates balanced wiring, improves process stability, and achieves the further narrowing design of the non-display area 102.

Figure 13:
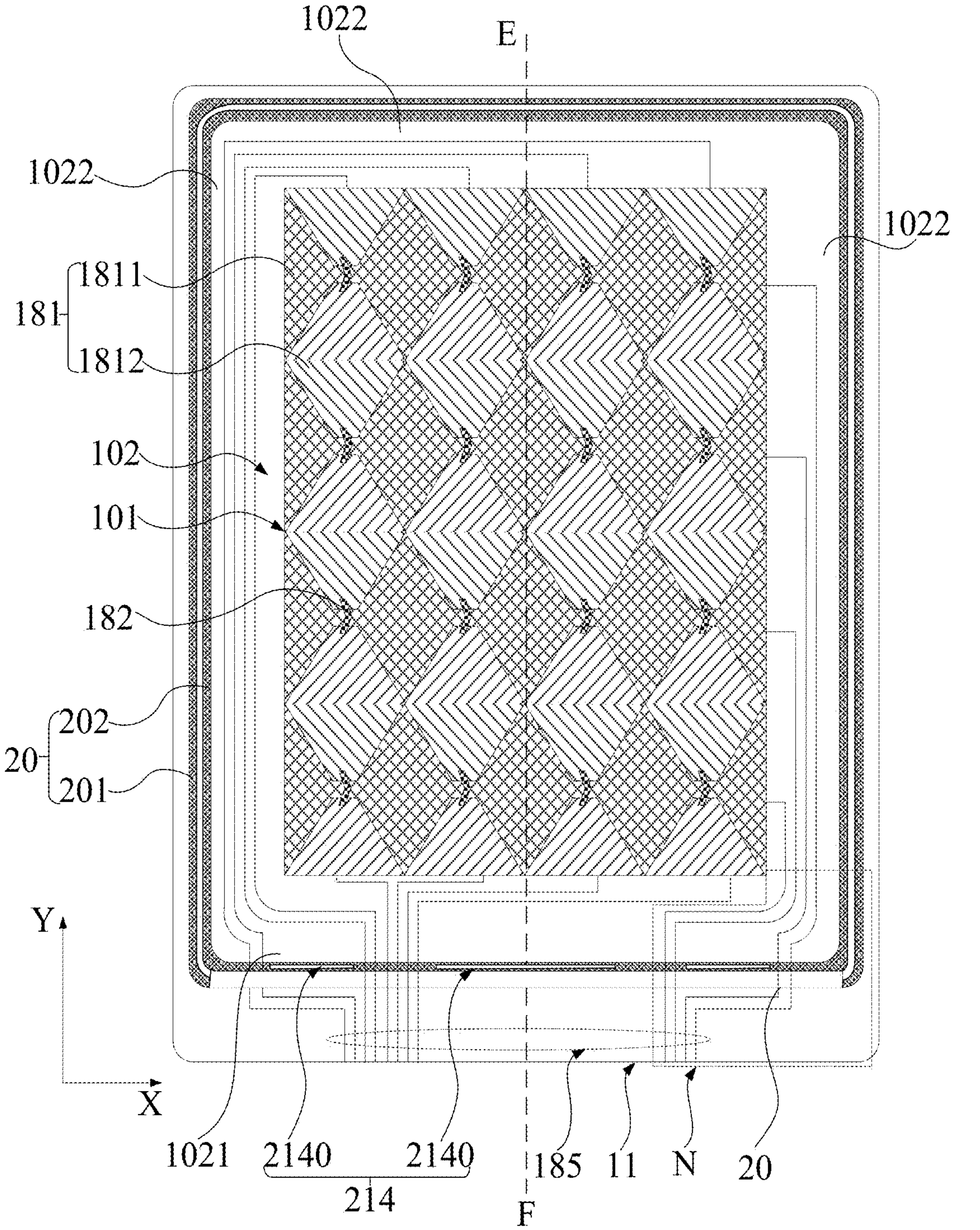
FIG. 13 is a schematic planar diagram of yet another display panel according to one embodiment of the present disclosure.

FIG. 13 shows another display panel. The difference from FIG. 12 is that the non-display area 102 of the display panel includes a binding region 1021 and a frame region 1022. The binding region 1021 is located at one side of the display area 101, and the binding region 1021 is only provided with a first blocking dam 202. A groove 204 is provided with at one side of the insulation layer group 203, of the first blocking dam 202 located in the binding region 1021, away from the substrate 11. The frame region 1022 is located at another side of the display area 101. A first blocking dam 202 and a second blocking dam 201 are sequentially provided along a direction away from the display area 101, in the frame region 1022. The first blocking dam 202 is surrounding the display area 101, and the second blocking dam 201 is surrounding the first blocking dam 202.

One embodiment of the present disclosure provides a display device. The display device may include the display panel as described in any of the above items.

It is to be noted that in addition to the display panel, the display device further includes other necessary components and parts, taking the display as an example, for example, a shell, circuit board, power cord, etc. Those skilled in the art may make corresponding supplements based on the specific usage requirements of the display device, which will be not repeated herein.

The display device may be a traditional electronic device, such as a mobile phone, computer, television, and camcorder, or an emerging wearable device, such as a VR glass, which will not be listed here.

Those skilled in the art will easily come up with other embodiments of the present disclosure after considering the specification and practicing the invention disclosed herein. The purpose of the present disclosure is to cover any variations, uses, or adaptations of the present disclosure, which follow the general principles of the present disclosure and include common knowledge or commonly used technical means in the technical field that are not disclosed in the present disclosure. The specification and embodiments are only considered to be examples, and the true scope and spirit of the present disclosure are indicated by the appended claims.

What is claimed is:

1. A display panel, provided with a display area and a non-display area connected to the display area, wherein the display panel comprises:

a substrate;

a first lead line, located at one side of the substrate, and extending from the display area to the non-display area;

a blocking dam, located in the non-display area and surrounding the display area, wherein the blocking dam comprises an insulation layer group, the insulation layer group is located at one side of the first lead line away from the substrate, a groove is provided at one side of the insulation layer group away from the substrate, and a depth of the groove is less than a thickness of the insulation layer group; and an encapsulation layer, located at one side of the blocking dam away from the substrate, wherein the encapsulation layer comprises an organic encapsulation layer, and an orthographic projection of an edge of the organic encapsulation layer, away from the display area, on the substrate is located within an orthographic projection of the blocking dam on the substrate;

wherein the groove comprises a plurality of groove branches parallel to each other, the plurality of the groove branches are located at one side of the blocking dam close to the display area, a convex body is formed at one side of the plurality of the groove branches away from the display area, a plurality of convex branches are formed among the plurality of the groove branches, and the convex branch intersects with the convex body; or the groove is located in a middle portion of the blocking dam, the groove comprises a groove body and a plurality of groove branches, the groove body is provided along the extension direction of the blocking dam, the plurality of the groove branches are located at one side of the groove body away from the display area, and the plurality of the groove branches communicate with the groove body; or the insulation layer group comprises a first insulation layer, a second insulation layer and a third insulation layer sequentially arranged in a direction away from the substrate; and the depth of the groove is equal to a thickness of the third insulation layer, or a sum of a thickness of the second insulation layer and a thickness of the third insulation laver; or the groove comprises a plurality of groove segments spaced along an extension direction of the blocking dam, and the display panel further comprises: a second lead line, located at one side of the encapsulation layer away from the substrate and located between two adjacent groove segments.

2. The display panel according to claim 1, wherein an angle of 20-30 degrees is formed between the convex branch and the convex body.

3. The display panel according to claim 1, wherein a width of the convex body is 1/6-1/3 of a width of the blocking dam, a width of the convex branch is 1/3-1/2 of the width of the blocking dam, and a distance between two adjacent convex branches is 1/6-5/12 of the width of the blocking dam.

4. The display panel according to claim 1, wherein along a thickness direction of the display panel, a width of the convex branch is gradually reduced from one side of the convex branch close to the substrate to one side of the convex branch away from the substrate.

5. The display panel according to claim 1, wherein one surface of the convex branch close to the display area is an inclined surface inclined in a direction away from the display area, and one surface of the convex body close to the display area is an inclined surface inclined in a direction away from the display area.

6. The display panel according to claim 1, wherein the groove is located in the middle portion of the blocking dam, the plurality of the groove branches are parallel to each other, and an angle of 20-60 degrees is formed between the groove branch and the groove body.

7. The display panel according to claim 6, wherein a width of the groove body is 1/6-1/4 of a width of the blocking dam, a length of the groove branch is 1/6-1/2 of the width of the blocking dam, and a width of the groove branch is 1/6-5/12 of the width of the blocking dam.

8. The display panel according to claim 1, wherein the groove is located in the middle portion of the blocking dam, and a width of the groove is gradually increased from one side of the groove close to the substrate to one side of the groove away from the substrate.

9. The display panel according to claim 1, wherein a width of the groove is 1/3-7/12 of a width of the blocking dam.

10. The display panel according to claim 1, wherein a width of the blocking dam is 50 um~80 um.

11. The display panel according to claim 1, wherein a distance between two adjacent groove segments is 30 um~100 um.

12. The display panel according to claim 1, further comprising:

a first planarization layer, located at the one side of the first lead line away from the substrate and located in the display area;

a pixel definition layer, located at one side of the first planarization layer away from the substrate;

wherein the first insulation layer is provided in a same layer and formed in a same material as the first planarization layer, and the third insulation layer is provided in a same layer and formed in a same material as the pixel definition layer.

13. The display panel according to claim 12, further comprising:

a second planarization layer, located between the first planarization layer and the pixel definition layer;

wherein the second insulation layer is located between the first insulation layer and the third insulation layer, and the second insulation layer is provided in a same layer and formed in a same material as the second planarization layer.

14. The display panel according to claim 1, wherein the non-display area comprises:

a binding region, located at one side of the display area, wherein the binding region is provided with one blocking dam;

a frame region, located at another side of the display area, wherein a plurality of blocking dams are sequentially provided, along a direction away from the display area, in the frame region.

15. The display panel according to claim 14, wherein the groove is located at one side of the insulation layer group, of the blocking dam in the binding region, away from the substrate.

16. A display device, comprising a display panel, wherein the display panel is provided with a display area and a non-display area connected to the display area, and comprises:

a substrate;

a first lead line, located at one side of the substrate, and extending from the display area to the non-display area;

a blocking dam, located in the non-display area and surrounding the display area, wherein the blocking dam comprises an insulation layer group, the insulation layer group is located at one side of the first lead line away from the substrate, a groove is provided at one side of the insulation layer group away from the substrate, and a depth of the groove is less than a thickness of the insulation layer group; and an encapsulation layer, located at one side of the blocking dam away from the substrate, wherein the encapsulation layer comprises an organic encapsulation layer, and an orthographic projection of an edge of the organic encapsulation layer, away from the display area, on the substrate is located within an orthographic projection of the blocking dam on the substrate;

wherein the groove comprises a plurality of groove branches parallel to each other, the plurality of the groove branches are located at one side of the blocking dam close to the display area, a convex body is formed at one side of the plurality of the groove branches away from the display area, a plurality of convex branches are formed among the plurality of the groove branches, and the convex branch intersects with the convex body; or the groove is located in a middle portion of the blocking dam, the groove comprises a groove body and a plurality of groove branches, the groove body is provided along the extension direction of the blocking dam, the plurality of the groove branches are located at one side of the groove body away from the display area, and the plurality of the groove branches communicate with the groove body; or the insulation layer group comprises a first insulation layer, a second insulation layer and a third insulation layer sequentially arranged in a direction away from the substrate; and the depth of the groove is equal to a thickness of the third insulation layer, or a sum of a thickness of the second insulation layer and a thickness of the third insulation layer; or the groove comprises a plurality of groove segments spaced along an extension direction of the blocking dam, and the display panel further comprises: a second lead line, located at one side of the encapsulation layer away from the substrate and located between two adjacent groove segments.

* * * * *